United States Patent [19]

Norton et al.

[11] 4,035,794
[45] July 12, 1977

[54] RADIATION SUPPRESSED KEYBOARD

[75] Inventors: Daniel J. Norton, Hudson; Rupert J. Cooke, Amherst, both of N.H.

[73] Assignee: Harris Corporation, Cleveland, Ohio

[21] Appl. No.: 633,303

[22] Filed: Nov. 19, 1975

[51] Int. Cl.² ............................................. G08C 25/00
[52] U.S. Cl. ............................. 340/365 E; 336/84; 340/365 R; 361/400
[58] Field of Search ........ 340/365 R, 365 S, 365 E; 317/101 B, 101 C, 101 CM, 101 CC; 336/84, 84 M; 330/66, 68; 178/69 R, 69 N, 69 B; 200/5 A

[56] References Cited

U.S. PATENT DOCUMENTS

| | | | |
|---|---|---|---|
| 2,690,536 | 9/1954 | Adams | 336/84 M |
| 2,826,748 | 3/1958 | Newton | 336/84 R |
| 3,202,879 | 8/1965 | Sterling | 317/101 CM |
| 3,624,645 | 11/1971 | Gluck et al. | 340/365 E |
| 3,701,958 | 10/1972 | Jaag | 317/101 CM |

OTHER PUBLICATIONS

Marston, "Using Cosmos Digital IC's", Radio-Electronics, Nov. 1974, p. 54.
Runyon, "Focus on Keyboards", Electronic Design 23, Nov. 1972, pp. 54–64.

*Primary Examiner*—John W. Caldwell
*Assistant Examiner*—James J. Groody

[57] ABSTRACT

A keyboard for use with a data processing display terminal utilizing a cathode ray tube (CRT) display is provided from which information bearing electromagnetic radiations are suppressed using solid state keyboard switches having no contact bounce and generating low level signals with few transients, metallic oxide silicon (MOS) semiconductor circuitry having relatively low switching speeds to generate few transients, careful packaging of components to minimize printed circuit path and wiring lengths, ferrite beads on component leads to suppress transient generation, and shielding of printed circuit paths by sandwiching them between ground planes.

6 Claims, 5 Drawing Figures

RADIATION SUPPRESSED KEYBOARD

FIELD OF THE INVENTION

This invention relates to a communication terminal and more particularly to an electromagnetic radiation suppressed keyboard for use with such terminals.

BACKGROUND OF THE INVENTION

Almost all electronic equipment emits various amounts of spurious electromagnetic energy as radio waves and by conduction along power leads and signal leads connected to the equipment. Techniques exist for suppression of the conducted electromagnetic energy but the radiated electromagnetic energy is undesirable as it oftentimes causes interference with the functioning of other equipment which is in close proximity thereto.

Spurious radiated electromagnetic energy also causes another problem. In communications, data processing and other equipment the information being processed can be extracted from the spurious electromagnetic radiation. In government and industrial security applications the signals or data that may be detected may be proprietary or classified in nature and will compromise the security of the system. This is unacceptable in many commercial applications and potentially disastrous in military and other governmental applications in which national security is at stake.

In the past, spurious radiations emanating from equipment have typically been suppressed by completely enclosing the equipment in a shielded container. This is a brute force approach to spurious radiation suppression and there is a need for more acceptable techniques to reduce generation of spurious radiation to acceptable levels.

Accordingly, it is an object of this invention to provide a new and improved keyboard from which spurious radiations are reduced to acceptable low levels.

More particularly, it is an object of our invention to provide an improved keyboard that minimizes generation of spurious radiations rather than suppressing them after generation.

SUMMARY OF INVENTION

In accordance with the teaching of our invention we have invented a new reliable keyboard utilizing modern technological advances that generates only low level spurious radiation that does not interfere with the operation of other electronic equipment, and which are not easily detected or cannot be detected to clandestinely extract the information being conveyed by operation of the keyboard.

To accomplish the above, electrical components for our keyboard are chosen that are relatively slow operating in the digital art and use no repetitive signals such as clocks and thereby minimizes spurious signals and signal synchronization signals. In addition, the electrical components of the keyboard are arranged to keep circuit paths as short as possible. Also, printed circuit paths interconnecting components of our keyboard are shielded by sandwiching the printed circuit board having the paths interconnecting electrical components between two other printed circuit boards the metal of each of which is electrically grounded and acts as shielding to minimize radiation of those transients that are generated. Finally, ferrite beads are then threaded onto driver transistor leads before the transistors are mounted on the printed circuit boards in order to suppress high frequency oscillations generated by these transistors as they amplify keyboard signals to drive other equipment.

BRIEF DESCRIPTION OF THE DRAWINGS

The above and other objects and features of our invention will become more apparent upon consideration of the following detailed description in conjunction with the drawing, in which.

DETAILED DESCRIPTION

Figure 1:
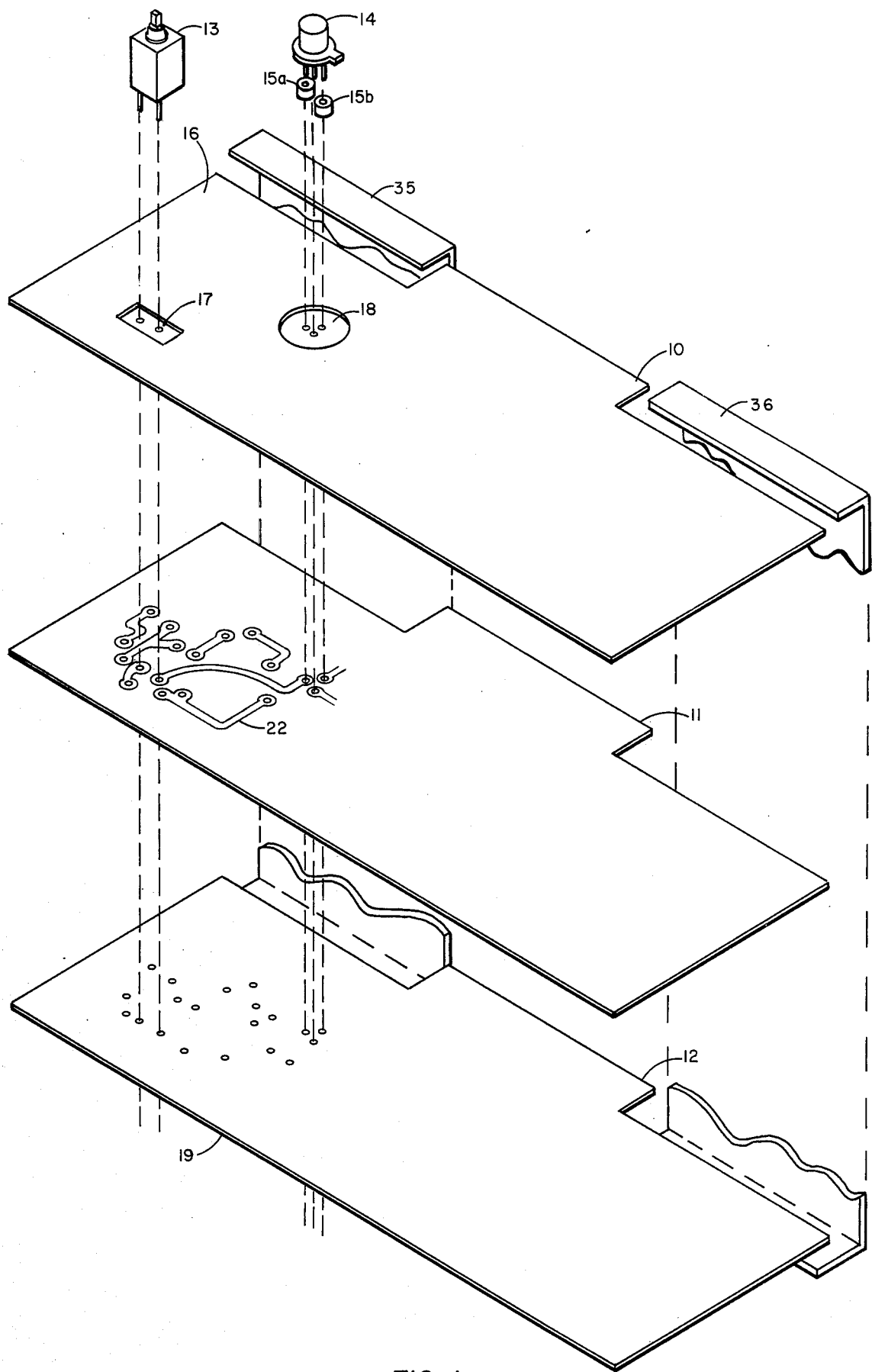
FIG. 1 is an exploded top view of our printed circuit board mounted keyboard showing only two representative electrical components of the keyboard.
Figure 2:
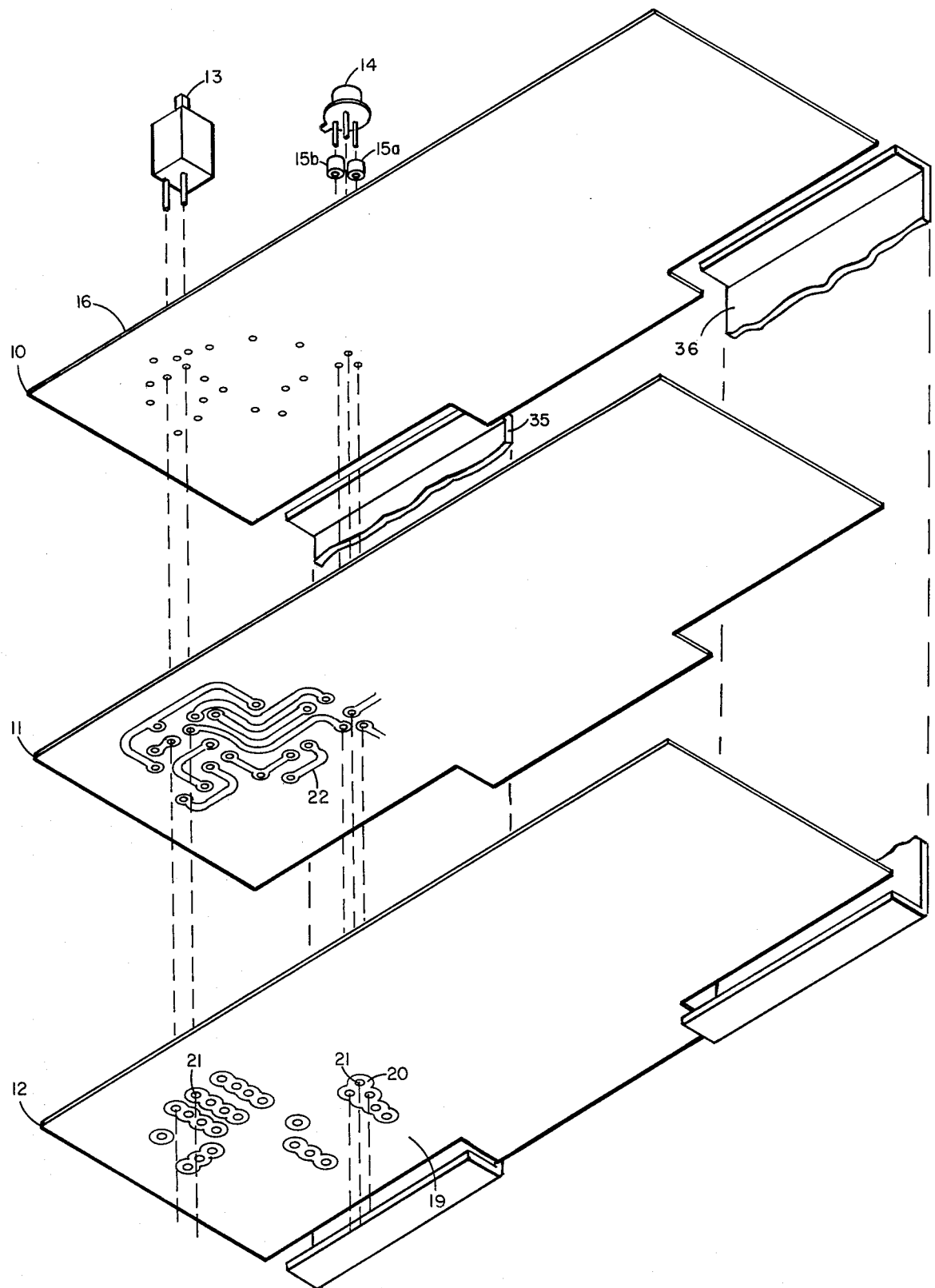
FIG. 2 is an exploded bottom view of our printed circuit board mounted keyboard showing the two representative electrical components.

Referring now to FIG. 1, therein is shown the exploded view of the printed circuit boards 10, 11 and 12 which are normally sandwiched together and upon which the electrical components of our novel keyboards are mounted. A keyboard normally contains in the order of 50 to 60 keys, a number of integrated circuits, a number of transistors, and a number of resistors and capacitors, all of which are not shown as they are not all necessary to understand the teaching of our invention. Accordingly, we show only a representative keyboard key 13 and a representative transistor 14 and a few representative printed circuit paths interconnecting them. In accordance with the teaching of our invention, printed circuit boards 10, 11 and 12 are normally sandwiched together as shown in FIG. 4. Boards 10, 11 and 12 are shown in an exploded view in FIG. 1 to better understand the shielding technique of our novel keyboard. Board 11 is a conventional two-sided printed circuit board on both sides of which are etched circuit paths 22 for interconnecting electrical components in a well known manner. In FIG. 1 the representative printed circuit paths 22 are shown on the top side of board 11 but there are printed circuit paths 22 on the bottom side of board 11 also as may be seen in FIG. 2. Printed circuit board material typically comprises an insulating base material, such as fiber glass, upon which is bonded a thin layer of copper. Unwanted copper is then etched away utilizing photographic techniques leaving only printed circuit paths 22 as shown on board 11. On printed circuit board 10, however, the copper layer 16 is left fairly well intact to provide shielding. The copper is only removed in areas such as areas 17 and 18 where electrical components such as key 13 and transistor 14 are mounted. This is done in order that the electrical components will not contact copper sheet 16 which is electrically grounded to provide shielding against spurious radiations that may be generated. Similarly, copper sheeting is also left on the bottom side of board 12 to provide shielding as is shown in FIG. 2. Boards 10 and 12 are only single sided printed circuit boards, that is, copper is only found on the top side of board 10 and only on the bottom side of board 12. As a result, when boards 10, 11 and 12 are sandwiched together the printed circuit paths on the top and bottom sides of board 11 contact only the insulating fiber glass or other base material of boards 10 and 12. When boards 10, 11 and 12 are sandwiched together, copper plating 16 on board 10 and similar copper plating 19 on the bottom of board 12 are electrically grounded and provide electrical shielding to the printed circuit paths 22 on the top and bottom of board 11 to greatly reduce electromagnetic radiation emanation caused by electrical signals carried on the printed circuit paths 22 of board 11. In order to assure that copper plating 16 on board 10 and copper plating 19 on board 12 are at the same potential, elongated copper straps 35 and 36 are fastened onto the edge of boards 10, 11 and 12 as shown in FIGS. 1, 2, 3 and 4 when the boards are sandwiched together to electrically connect plating 16 and plating 19.

It can also be seen in FIG. 1 that holes drilled through boards 10, 11 and 12 must be coaxial in order for the leads or terminals of electrical components such as key 13 and transistor 14 to pass through all three boards when they are sandwiched together. Components such as 13 and 14 are then electrically connected to printed circuit paths 22 of board 11 utilizing conventional wave soldering and through hole soldering techniques. Wave solder bath equipment would be located below board 12 and the solder flows through the holes drilled coaxially through boards 11 and 12 to form an electrical connection between the leads or terminals of electrical components such as 13 and 14 and the printed circuit paths 22 on the top and bottom side of board 11.

In FIG. 1 is also seen ferrite beads 15a and 15b, through the holes of which the emitter and collector leads of transistor 14 pass before assembly onto boards 10, 11 and 12. Ferrite beads such as 15a and 15b act as an inductor in a circuit and suppress generation of high frequency electromagnetic oscillations that cause electromagnetic energy to be radiated.

Turning now to FIG. 2, therein is shown the bottom exploded view of boards 10, 11 and 12, key 13, transistor 14, and ferrite beads 15a and 15b. The representative printed circuit paths 22 on the bottom side of board 11 are shown. The bottom of board 12 is also clearly seen in FIG. 2 and, more particularly, its copper plating 19 is seen with the copper being etched away from areas such as area 20. Where each lead or a terminal of an electrical component such as 13 and 14 passes through board 12, upon assembly, copper sheet 19 is etched such that a small donut shaped copper land area such as area 21 remains with the center of the donut being the hole through board 12 through which each lead or terminal passes. The wave soldering process then through solders as discussed previously and also solders the lead or terminal to this small donut shaped copper land area 21 for the purpose of mechanical stability. Copper is etched away from the area immediately surrounding the donut shaped area just discussed so that the leads or terminals of electrical components such as 13 and 14 are not electrically connected to copper sheet 19 of board 12. Copper sheet 19 is also electrically grounded to provide shielding as mentioned previously.

In summary, copper sheet 16 of board 10 and copper sheet 19 of board 12 do not contact the electrical components but are electrically interconnected and then are electrically grounded to provide radio frequency shielding which minimizes emanation of electromagnetic radiation generated by signals carried on paths 22 of board 11.

Figure 3:
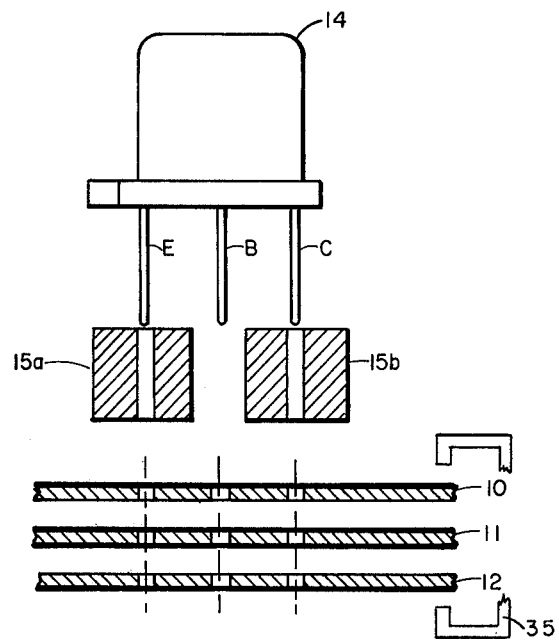
FIG. 3 is an exploded cross-sectional view of the two sided printed circuit board used for interconnecting keyboard components and which is sandwiched between two printed circuit boards for shielding purposes and the ferrite beads mounted on terminals of a transistor for suppressing radiation generation.
Figure 4:
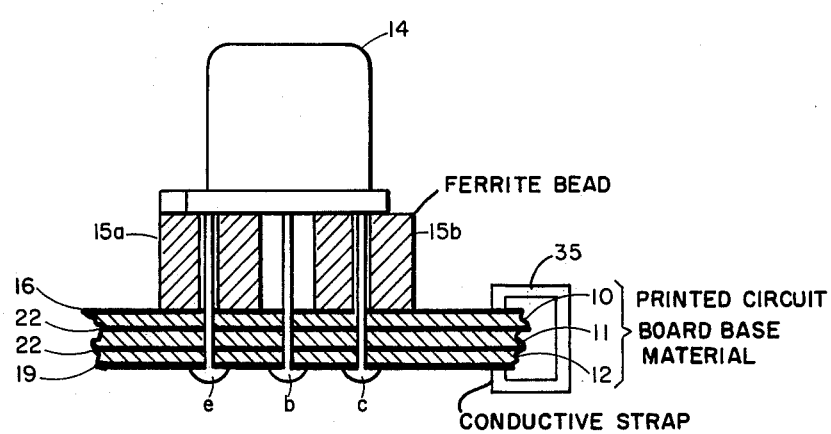
FIG. 4 is an assembled cross-sectional view of a transistor with ferrite beads, both mounted on the sandwiched printed circuit boards.

Turning now to FIG. 3 therein is shown an exploded cross-sectional view of a representative portion of our keyboard showing transistor 14, ferrite beads 15a and 15b, and printed circuit boards 10, 11 and 12. Emitter lead E and collector lead C of transistor 14 pass through the holes in ferrite bead 15a and 15b, respectively. Emitter, base and collector leads E, B and C respectively, of transistor 14 then pass through the coaxial holes drilled through printed circuit boards 10, 11 and 12 as shown in FIG. 4. Conventionally, inductors used to suppress generation of electromagnetic radiation have at least two leads and would have to be mounted on a printed circuit board in a conventional manner. More printed circuit paths would be needed to interconnect such a discrete inductor to other electrical components. In our arrangement, however, ferrite beads 15a and 15b act as inductors at the frequencies at which the spurious electromagnetic radiations we are interested in are generated. Ferrite beads 15a and 15b are threaded onto the emitter E and collector C leads of transistor 14 and provide the appropriate inductive effect in the circuit of suppressing spurious radiation while at the same time not having to be mounted on the printed circuit board remote from transistor 14 and then having to be connected to transistor 14 by printed circuit paths.

Turning now to FIG. 4, therein is shown a cross-section view of our assembled novel keyboard showing transistor 14 mounted on the board. It can be seen that the emitter E, base B and collector C leads of transistor 14 pass through the ferrite beads 15a and 15b as previously described and then pass through boards 10, 11 and 12. The wave soldering process causes solder to flow up through the coaxial holes through boards 11 and 12 to form a soldered electrical connection between the transistor leads E, B. and C and the printed circuit paths 22 on the upper and lower side of board 11. In addition, the wave soldering process also causes leads E, B and C of transistor 14 to be soldered to the donut shaped land areas 21 on the bottom side of board 12 to provide structural strength as described previously. Finally, the shielding effect of electrically grounded copper sheet 16 of board 10 and copper sheet 19 of board 12 can be seen as they are sandwiched on either side of board 11. In addition, electrical strap 35 can be seen contacting plating 16 on board 10 and plating 19 on board 12, as previously described.

Figure 5:
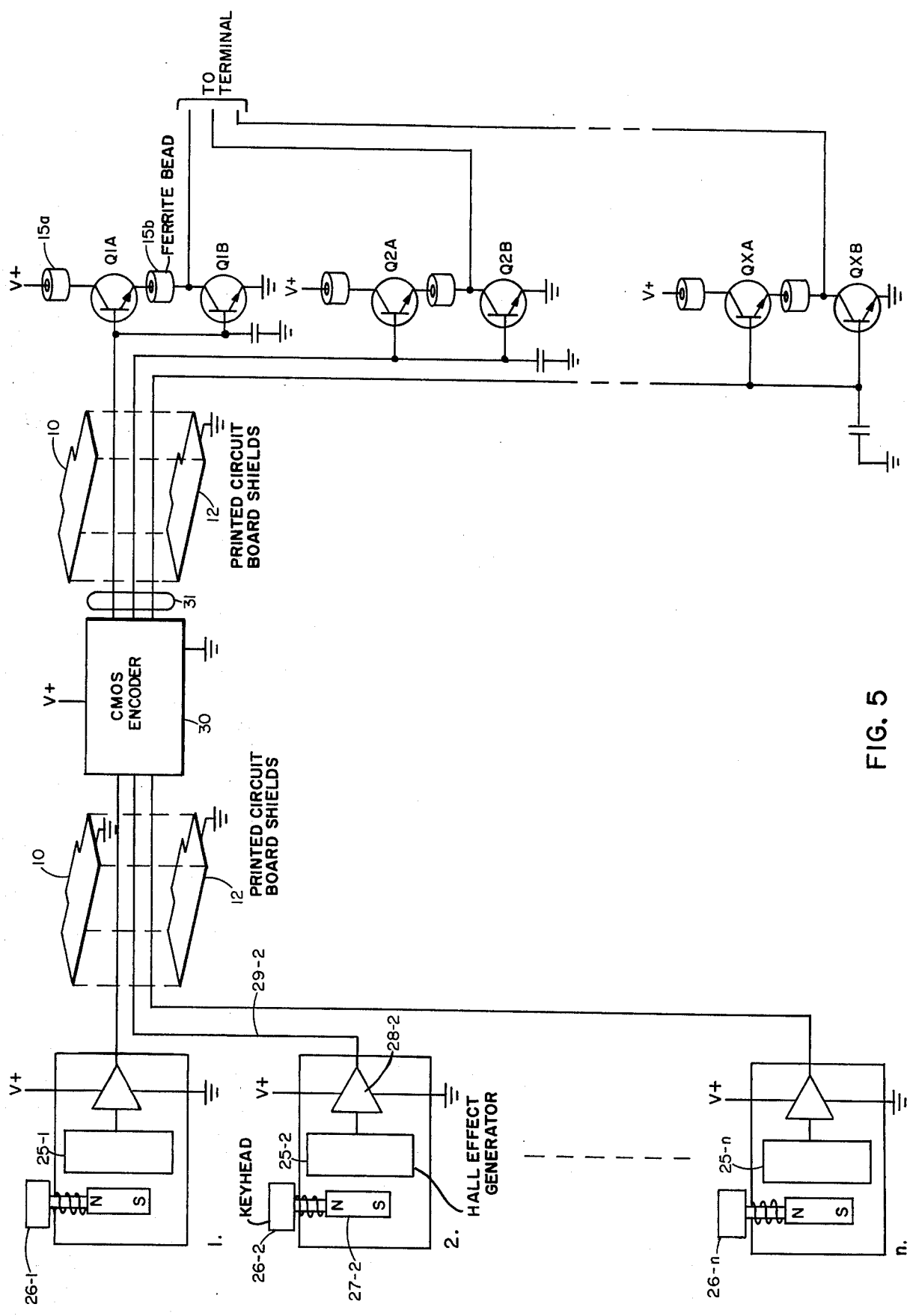
FIG. 5 is a pictorial schematic diagram of our keyboard circuitry and the means for transient suppression thereof.

Turning now to FIG. 5 therein can be seen a pictorial schematic diagram of our printed circuit board mounted keyboard and including our novel techniques for minimizing the generation of and emanation of spurious electromagnetic radiation. Every keyboard has a large plurality of keys, these are represented by the keys designated 1, 2 through n in FIG. 5. In this embodiment of invention, these key switches utilize Hall effect devices designated 25-1, 25-2, through 25-n in these same key switches. In a Hall effect keyswitch, when a key 26- is depressed, it moves a small permanent magnet into proximity with a sensor in the switch and the sensor generates a signal. For example, when key switch 26-2 is depressed, its magnet 27-2 is moved into proximity with Hall-effect sensor 25-2 which generates a signal which is input to an amplifier 28-2. The output from sensor 25-2 is of a low level and is effectively amplified by amplifier 28-2 to provide an output signal on lead 29-2 which is input to encoder 30. It should be noted from our previous discussion that the key switches are mounted on the sandwiched printed circuit boards 10, 11 and 12 and the printed circuit paths on board 11 which interconnect the key switches with encoder 30 are sandwiched between boards 10 and 12 for shielding as figuratively shown in FIG. 5.

Encoder 30 consists of integrated circuit read-only memories (ROM's) which are programmed in a manner well-known in the art to take the key inputs and which provide outputs which are generally encoded into an ASCII code format, but which may be coded in any other code format as desired. These ROM's are selected to have high density packaging in order to reduce the surface area of the devices from which radiation can occur. In accordance with the further teaching of our invention, the integrated circuit ROM's that comprise encoder 30 utilize complimentary metallic oxide silicon (CMOS) semiconductor technology. CMOS devices are relatively slow in regards to switching speed when compared to other devices. As is well known in the art, CMOS devices are available in what are called N-channel devices and P-channel devices, and the P-channel devices switch at slower speeds than the N-channel devices, so P-channel CMOS ROM's are used in our novel keyboard. As a result of their slower switching speed, the P-channel CMOS ROM's have fewer switching transients that generate spurious radiation.

It should be recognized that as the encoder 30 is made up of a number of integrated circuits, which are also mounted on boards 10, 11 and 12, the outputs 31 from encoder 30 are printed circuit paths on board 11 and are shielded by boards 10 and 12 as shown in FIG. 5. Outputs 31 from encoder 30 are then amplified by driver transistors Q1A and Q1B, to QXA and QXB. The driver transistors amplify the output of encoder 30 to a level sufficient to drive whatever circuitry to which the keyboard may be connected.

As the driver transistors in FIG. 5 are switched on and off by the output signals from encoder 30 they have switching transients that generate the spurious radiation. With the ferrite cores threaded onto the emitter and collector leads of each switching transistor the inductive effect of the cores suppresses the switching transients and thereby suppresses generation of spurious electromagnetic radiation.

It is apparent that various modifications may be made to the preferred embodiment of our invention described above without departing from the spirit and scope of the invention.

What we claim is:

1. A data processing terminal keyboard in which spurious information bearing electromagnetic radiation is suppressed comprising
    a first printed circuit board having printed circuit paths thereon,
    at least one keyswitch with said keyswitch generating low level switching signals having few transients upon being actuated,
    means for encoding said keyswitch signals, said encoding means being connected to said keyswitch via first printed circuit paths on said first board,
    means for amplifying encoded keyswitch signals output from said encoding means and applying said amplified signals to output leads for application to other equipment in said data processing terminal, said amplifying means being connected to said encoding means via second printed circuit paths on said first board,
    a second printed circuit board placed parallel to the top of said first board said second board having its conductive circuit path material electrically grounded to shield said first board and minimize said radiation caused by said switching signals and said encoded keyswitch signals on said first and said second printed circuit paths radiating from said keyboard, the conductive circuit path material on said second board being electrically insulated from said printed circuit paths on said first board,
    a third printed circuit board placed parallel to the bottom of said first board said third board having its conductive circuit path material electrically grounded to shield said first board and minimize said radiation caused by said switching signals and said encoded keyswitch signals on said first and said second printed circuit paths radiating from said keyboard, the conductive circuit path material on said third board being electrically insulated from said printed circuit paths on said first boards, said first board being sandwiched between said second and said third boards, and
    beads having inductive properties and each bead having a hole therethrough with selected ones of the leads of said amplifying means passing through the hole in ones of said beads to suppress generation of said radiation.

2. The invention in accordance with claim 1 wherein said beads are ferrite beads and wherein said amplifying means comprises driver transistors the emitter and collector leads of each of which are individually threaded through the holes in ones of said ferrite beads to suppress generation of said electromagnetic radiation by said transistors.

3. The invention in accordance with claim 2 wherein said encoding means comprises complimentary metallic oxide silicon semiconductor devices having high internal packing density which switch at speeds that generate low level switching transients to thereby minimize said spurious electromagnetic radiation.

4. The invention in accordance with claim 3 wherein said keyswitch comprises a Hall-effect device which generates a low level switching signal having few switching transients to thereby minimize spurious electromagnetic radiation.

5. The invention in accordance with claim 4 wherein terminals and leads of said keyswitch, said encoding means, and said amplifying means pass through all of said boards when said boards are sandwiched together via coaxial oriented holes through all of said boards, with just enough conductive circuit path material on said second and said third boards being removed so that said keyswitch, said encoding means, and said amplifying means as well as the terminals and leads thereof are not electrically connected to said electrically grounded circuit path material on said second and said third boards.

6. The invention in accordance with claim 5 further comprising strapping means electrically interconnecting said conductive circuit path material on said second and said third printed circuit boards.

* * * * *